(12) United States Patent
Hatano

(10) Patent No.: US 11,791,716 B2
(45) Date of Patent: Oct. 17, 2023

(54) POWER SUPPLY CONTROL DEVICE AND SWITCHING POWER SUPPLY INCLUDING START-UP CIRCUIT

(71) Applicant: Rohm Co., Ltd., Kyoto (JP)

(72) Inventor: Hiroyuki Hatano, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 31 days.

(21) Appl. No.: 17/347,967

(22) Filed: Jun. 15, 2021

(65) Prior Publication Data
US 2022/0014090 A1 Jan. 13, 2022

(30) Foreign Application Priority Data
Jul. 9, 2020 (JP) .................. 2020-118394

(51) Int. Cl.
*H02M 1/36* (2007.01)
*H02M 1/00* (2006.01)
*H02M 3/335* (2006.01)

(52) U.S. Cl.
CPC ........... *H02M 1/36* (2013.01); *H02M 1/0006* (2021.05); *H02M 3/33592* (2013.01)

(58) Field of Classification Search
None
See application file for complete search history.

(56) References Cited

U.S. PATENT DOCUMENTS

| | | | |
|---|---|---|---|
| 9,906,140 B2* | 2/2018 | Zhang | H02M 3/33507 |
| 10,003,331 B2* | 6/2018 | Ikeda | H01L 27/0629 |
| 10,243,451 B1* | 3/2019 | Knoedgen | H02M 3/33569 |
| 10,720,914 B1* | 7/2020 | Koyama | H03K 17/102 |
| 10,777,513 B2* | 9/2020 | Moreau | H01L 21/8236 |
| 2020/0328730 A1* | 10/2020 | Augustoni | H03K 3/012 |

FOREIGN PATENT DOCUMENTS

JP 2020-022297 2/2020

\* cited by examiner

*Primary Examiner* — Jeffrey A Gblende
(74) *Attorney, Agent, or Firm* — Fish & Richardson P.C.

(57) ABSTRACT

A power supply control device includes: a drive switch circuit formed by cascade-connecting a depletion type first transistor and an enhancement type second transistor, and configured to drive a transformer of an insulated switching power supply; a control circuit configured to control the second transistor; and a start-up circuit configured to charge a power supply voltage of the control circuit by using a source voltage of the first transistor.

8 Claims, 9 Drawing Sheets

ND SWITCHING POWER SUPPLY INCLUDING START-UP CIRCUIT

POWER SUPPLY CONTROL DEVICE AND SWITCHING POWER SUPPLY INCLUDING START-UP CIRCUIT

CROSS-REFERENCE TO RELATED APPLICATION

This application is based upon and claims the benefit of priority from Japanese Patent Application No. 2020-118394, filed on Jul. 9, 2020, the entire contents of which are incorporated herein by reference.

TECHNICAL FIELD

The present disclosure relates to a power supply control device.

BACKGROUND

Conventionally, a power supply control device having a start-up circuit is known.

However, the conventional power supply control device has a room for further miniaturization and higher frequency operations.

SUMMARY

For example, a power supply control device disclosed in the present disclosure includes: a drive switch circuit formed by cascade-connecting a depletion type first transistor and an enhancement type second transistor, and configured to drive a transformer of an insulated switching power supply; a control circuit configured to control the second transistor; and a start-up circuit configured to charge a power supply voltage of the control circuit by using a source voltage of the first transistor (a first configuration).

In the power supply control device of the first configuration, the first transistor may be a GaN device (a second configuration).

In the power supply control device of the first or second configuration, the start-up circuit may include a switching circuit configured to electrically connect or cut off a path between an application terminal of the source voltage and an application terminal of the power supply voltage, and a comparison circuit configured to control the switching circuit by comparing the power supply voltage with a predetermined threshold voltage (a third configuration).

In the power supply control device of the third configuration, the start-up circuit may further include a diode connected between the application terminal of the source voltage and the switching circuit (a fourth configuration).

In the power supply control device of the third or fourth configuration, the start-up circuit may further include a first resistor connected between the application terminal of the source voltage and the switching circuit (a fifth configuration).

In the power supply control device of any one of the third to fifth configurations, the switching circuit may include: a third transistor connected between the application terminal of the source voltage and the application terminal of the power supply voltage; a fourth transistor connected between a gate of the third transistor and a reference potential terminal, and configured to be controlled according to an output signal of the comparison circuit; and a second resistor connected between the gate and a drain of the third transistor (a sixth configuration).

In the power supply control device of the sixth configuration, the switching circuit may further include a fifth transistor diode-connected between the gate and the drain of the third transistor (a seventh configuration).

In the power supply control device of the sixth or seventh configuration, the switching circuit may further include a Zener diode connected between the gate of the third transistor and the reference potential terminal (an eighth configuration).

The power supply control device of any one of the first to eighth configurations may be formed by sealing, in a package, a first chip in which the first transistor is integrated and a second chip in which the second transistor, the control circuit, and the start-up circuit are integrated (a ninth configuration).

For example, an insulated switching power supply disclosed in the present disclosure includes: a transformer including a primary winding connected to an application terminal of an input voltage, and a secondary winding and an auxiliary winding which are magnetically coupled to the primary winding; an output voltage generation part configured to generate an output voltage from an induced voltage of the secondary winding; a power supply voltage generation part configured to generate a power supply voltage from an induced voltage of the auxiliary winding; and the power supply control device of any one of the first to ninth configurations configured to control drive of the transformer by receiving the power supply voltage (a tenth configuration).

DETAILED DESCRIPTION

<Insulated Switching Power Supply>

Figure 1:
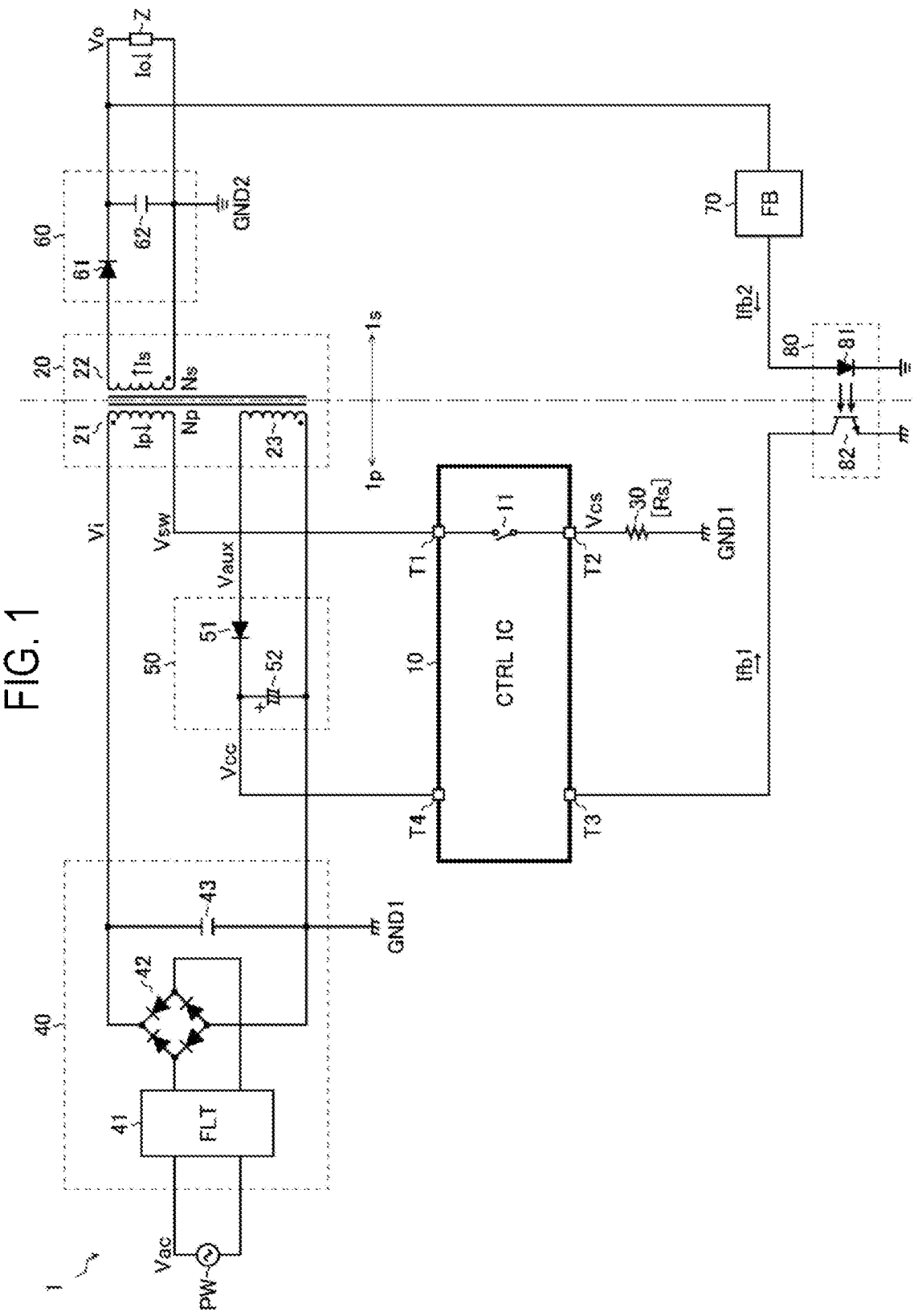
FIG. 1 is a diagram showing an overall configuration of an insulated switching power supply.

FIG. 1 is a diagram showing an overall configuration of an insulated switching power supply. An insulated switching power supply 1 is a fly-back type insulated AC/DC converter that, while electrically insulating a primary circuit system 1p (GND1 system) and a secondary circuit system is (GND2 system), converts an AC input voltage Vac supplied from an AC power supply PW into a DC output voltage Vo and supplies the DC output voltage Vo to a load Z. The insulated switching power supply 1 includes a power supply control device 10, a transformer 20, a sense resistor 30, an AC/DC conversion part 40, a power supply voltage generation part 50, an output voltage generation part 60, an output feedback part 70, and a photocoupler 80.

The power supply control device 10 is a monolithic semiconductor integrated circuit device (so-called power supply control IC) provided in the primary circuit system 1p, and is configured to control drive of the transformer 20 by receiving a power supply voltage Vcc. The power supply control device 10 includes external terminals T1 to T4 as means for establishing electrical connection with the outside of the device. In this figure, the external terminal T1 to which the transformer 20 is connected, the external terminal T2 to which a sense voltage Vcs is applied, the external terminal T3 through which a feedback current Ifb1 flows, and the external terminal T4 to which the power supply voltage Vcc is applied are representatively shown. However, external terminals other than the aforementioned ones may be provided. Further, the power supply control device 10 is formed by integrating a drive switch circuit 11 (details of which will be described later) between the external terminal T1 and the external terminal T2 to electrically connect or cut off a path through which a primary current Ip of the transformer 20 flows.

The transformer 20 includes a primary winding 21 (the number of turns: Np) and a secondary winding 22 (the number of turns: Ns) that are magnetically coupled to each other with opposite polarities while electrically insulating the primary circuit system 1p and the secondary circuit system 1s. A first end (winding start end) of the primary winding 21 is connected to an application terminal of a DC input voltage Vi (=an output terminal of the AC/DC conversion part 40). A second end (winding termination end) of the primary winding 21 is connected to the external terminal T1 of the power supply control device 10. A first end (winding termination end) of the secondary winding 22 is connected to an input terminal of the output voltage generation part (rectifying smoothing part) 60. A second end (winding start end) of the secondary winding 22 is connected to a ground terminal GND2 of the secondary circuit system 1s. The number of turns Np and the number of turns Ns may be arbitrarily adjusted so that a desired DC output voltage Vo can be obtained. For example, the DC output voltage Vo decreases as the number of turns Np increases or as the number of turns Ns decreases. Conversely, the DC output voltage Vo increases as the number of turns Np decreases or as the number of turns Ns increases. Further, the transformer 20 includes an auxiliary winding 23 in addition to the primary winding 21 and the secondary winding 22. The auxiliary winding 23 is used when generating the power supply voltage Vcc of the power supply control device 10.

The sense resistor 30 (resistance value: Rs) is connected between the external terminal T2 of the power supply control device 10 and a ground terminal GND1 (corresponding to a reference potential terminal) of the primary circuit system 1p to generate the sense voltage Vcs (=Ip×Rs) according to the primary current Ip of the transformer 20.

The AC/DC conversion part 40 is provided in the primary circuit system 1p to generate the DC input voltage Vi from the AC input voltage Vac. For example, the AC/DC conversion part 40 includes a filter 41, a diode bridge 42, and a capacitor 43. The filter 41 removes harmonic noise, common mode noise, or the like from the AC input voltage Vac. The diode bridge 42 full-wave rectifies the AC input voltage Vac to generate the DC input voltage Vi. The capacitor 43 smoothes the DC input voltage Vi. The AC/DC conversion part 40 may include a protective element such as a fuse or the like.

However, in a case where the DC input voltage Vi is supplied to the insulated switching power supply 1, the AC/DC conversion part 40 may be omitted. In that case, the insulated switching power supply 1 may be understood as a fly-back type insulated DC/DC converter.

The power supply voltage generation part 50 is a rectifying smoothing circuit provided in the primary circuit system 1p, and includes a diode 51 for rectification and a capacitor 52 for smoothing. Regarding a connection relationship thereof, an anode of the diode 51 is connected to the first end (winding termination end) of the auxiliary winding 23. Both a cathode of the diode 51 and a first end of the capacitor 52 are connected to the external terminal T4 of the power supply control device 10. A second end of the capacitor 52 is connected to the ground terminal GND1 of the primary circuit system 1p together with the second end (winding start end) of the auxiliary winding 23. The power supply voltage generation part 50 having the configuration described above rectifies and smoothes an induced voltage Vaux generated in the auxiliary winding 23 to generate the power supply voltage Vcc of the power supply control device 10, and applies the power supply voltage Vcc to the external terminal T4 of the power supply control device 10. A winding ratio between the primary winding 21 and the auxiliary winding 23 may be appropriately set in consideration of the power supply voltage Vcc required for operation of the power supply control device 10.

The output voltage generation part 60 is a rectifying smoothing circuit provided in the secondary circuit system 1s, and includes a diode 61 for rectification and a capacitor 62 for smoothing. Regarding a connection relationship thereof, an anode of the diode 61 is connected to the first end (winding termination end) of the secondary winding 22 as the input terminal of the output voltage generation part 60. Both a cathode of the diode 61 and a first end of the capacitor 62 are connected to an application terminal of the DC output voltage Vo (a high potential terminal of the load Z). A second end of the capacitor 62 is connected to the ground end GND2 of the secondary circuit system 1s together with a second end (a low potential terminal) of the load Z. The output voltage generation part 60 having the configuration described above rectifies and smoothes an induced voltage generated in the secondary winding 22 to generate the DC output voltage Vo.

The output feedback part 70 is provided in the secondary circuit system 1s, and is configured to generate a secondary side feedback current Ifb2 corresponding to the DC output voltage Vo or a DC output current Io and output the secondary side feedback current Ifb2 to the photocoupler 80. As the output feedback part 70, for example, a well-known circuit configuration using a shunt regulator may be adopted.

The photocoupler 80 includes a light emitting diode 81 provided in the secondary circuit system is and a phototransistor 82 provided in the primary circuit system 1p. The photocoupler 80 transmits a signal from the secondary circuit system is to the primary circuit system 1p while electrically insulating the primary circuit system 1p and the secondary circuit system 1s. More specifically, the photocoupler 80 converts the feedback current Ifb2 into an optical signal by emitting light from the light emitting diode 81 with a brightness corresponding to the feedback current Ifb2, and reconverts the optical signal into the primary side feedback current Ifb1 by detecting the optical signal with the phototransistor 82. Therefore, the feedback current Ifb1 fluctuates in the same manner as the feedback current Ifb2.

In the insulated switching power supply 1 shown in FIG. 1, an output feedback control is performed using the photocoupler 80. Alternatively, it may be possible to adopt, for example, a configuration in which an output feedback control is performed by generating a feedback voltage Vfb from the induced voltage Vaux of the auxiliary winding 23 (or a switch voltage Vsw appearing at the external terminal T1) and sampling/holding the feedback voltage Vfb.

<Basic Operation>

Next, a basic operation of the insulated switching power supply 1 will be briefly described. When the drive switch circuit 11 is turned on, the primary current Ip flows from the application terminal of the DC input voltage Vi to the ground terminal GND1 via the primary winding 21, the drive switch circuit 11, and the sense resistor 30. Therefore, electrical energy is stored in the primary winding 21.

Thereafter, when the drive switch circuit 11 is turned off, an induced voltage is generated in the secondary winding 22 that is magnetically coupled to the primary winding 21, and a secondary current Is flows from the secondary winding 22 toward the ground terminal GND2 via the diode 61. At this time, the DC output voltage Vo obtained by half-wave rectifying the induced voltage of the secondary winding 22 is supplied to the load Z.

Thereafter, the same switching operation as described above is repeated by turning on and off the drive switch circuit 11 at a predetermined switching frequency fsw. As described above, according to the insulated switching power supply 1, the DC output voltage Vo can be generated from the AC input voltage Vac and can be supplied to the load Z while electrically insulating the primary circuit system $1p$ and the secondary circuit system $1s$. A fly-back method adopted in the insulated switching power supply 1 has a smaller number of components than a forward method that requires a smoothing inductor. Therefore, the fly-back method is advantageous in terms of cost reduction.

<Power Supply Control Device>

Figure 2:
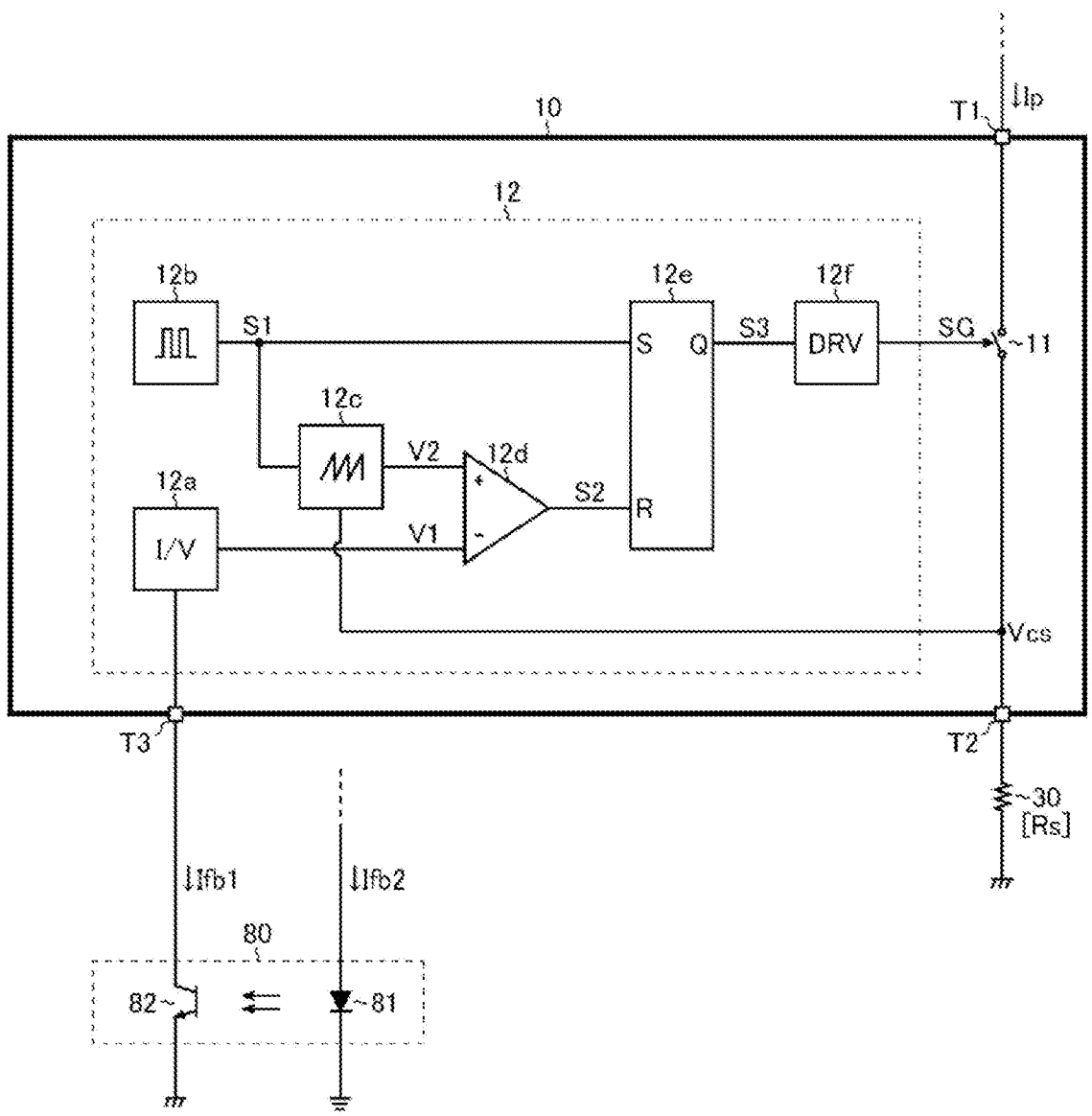
FIG. 2 is a diagram showing an overall configuration of a power supply control device.

FIG. 2 is a diagram showing an overall configuration of the power supply control device 10. In the power supply control device 10 of this configuration example, a control circuit 12 is integrated in addition to the drive switch circuit 11 described above.

The drive switch circuit 11 is connected between the external terminal T1 and the external terminal T2, and is configured to turn on or off the primary current Ip flowing through the primary winding 21 by electrically connecting or cutting off a current path extending from the application terminal of the DC input voltage Vi to the ground terminal GND1 via the primary winding 21 in response to a gate signal SG. For example, the drive switch circuit 11 is turned on when the gate signal SG is at a high level, and is turned off when the gate signal SG is at a low level.

The control circuit 12 is a circuit block that generates the gate signal SG according to the feedback current Ifb1 and the sense voltage Vcs. The control circuit 12 includes a current/voltage conversion circuit 12a, a clock signal generation circuit 12b, a slope voltage generation circuit 12c, a PWM (Pulse Width Modulation) comparator 12d, a logic circuit 12e, and a gate drive circuit 12f.

In addition to the circuit block described above, various protection circuits (a low input malfunction prevention circuit, a temperature protection circuit, an overcurrent protection circuit, an overvoltage protection circuit, and the like) may be appropriately incorporated in the power supply control device 10.

The current/voltage conversion circuit 12a generates a feedback voltage V1 corresponding to the feedback current Ifb1 flowing through the external terminal T3. For example, the feedback voltage V1 decreases as the feedback current Ifb1 increases, and increases as the feedback current Ifb1 decreases. As the simplest circuit configuration for implementing the above operation, it is conceivable to adopt, for example, a configuration in which a resistor (resistance value: R) is connected between an application terminal of a constant voltage Vreg and the external terminal T4 and in which a terminal voltage (=Vreg−Ifb1×R) appearing at the external terminal T4 is output as the feedback voltage V1.

The clock signal generation circuit 12b generates a clock signal S1, which has a rectangular waveform and is pulse-driven at the predetermined switching frequency fsw.

The slope voltage generation circuit 12c generates a slope voltage V2, which has a triangular waveform, a saw waveform, or an $n^{th}$-order slope waveform (e.g., n=2), in synchronization with the clock signal S1. Further, the slope voltage generation circuit 12c also has a function of giving an offset to the slope voltage V2 according to the sense voltage Vcs appearing at the external terminal T2 (=a voltage signal simulating behavior of the primary current Ip). By providing such an offset function, the output feedback control is performed by a current mode control, and thus it is possible to enhance stability of an output feedback loop and to improve transient response characteristics at the time of load fluctuation. However, when it is sufficient to perform the output feedback control by a voltage mode control, the sense resistor 30 may be omitted to further simplify the circuit configuration of the power supply control device 10.

The PWM comparator 12d generates a comparison signal S2 by comparing the feedback voltage V1 applied to an inverting input terminal (−) with the slope voltage V2 applied to a non-inverting input terminal (+). The comparison signal S2 has a low level when the slope voltage V2 is lower than the feedback voltage V1, and has a high level when the slope voltage V2 is higher than the feedback voltage V1.

The logic circuit 12e is an RS flip-flop that generates a PWM signal S3 in response to the clock signal S1 input to a set terminal (S) and the comparison signal S2 input to a reset terminal (R). The PWM signal S3 is set to a high level at a pulse edge of the clock signal S1, and is reset to a low level at a pulse edge of the comparison signal S2.

The gate drive circuit 12f generates the gate signal SG by receiving the PWM signal S3 as an input. The gate signal SG has a low level when the PWM signal S3 is at a high level, and has a high level when the PWM signal S3 is at a low level.

By the way, the power supply control device 10 requires a start-up circuit for charging the capacitor 52 (see FIG. 1) to raise the power supply voltage Vcc at the time of start-up thereof. Therefore, a detailed description will be given below by focusing on the start-up circuit of the power supply control device 10.

Start-up Circuit (Comparative Example)

First, prior to an explanation of a new embodiment of the start-up circuit, a comparative example to be compared therewith will be briefly explained.

Figure 3:
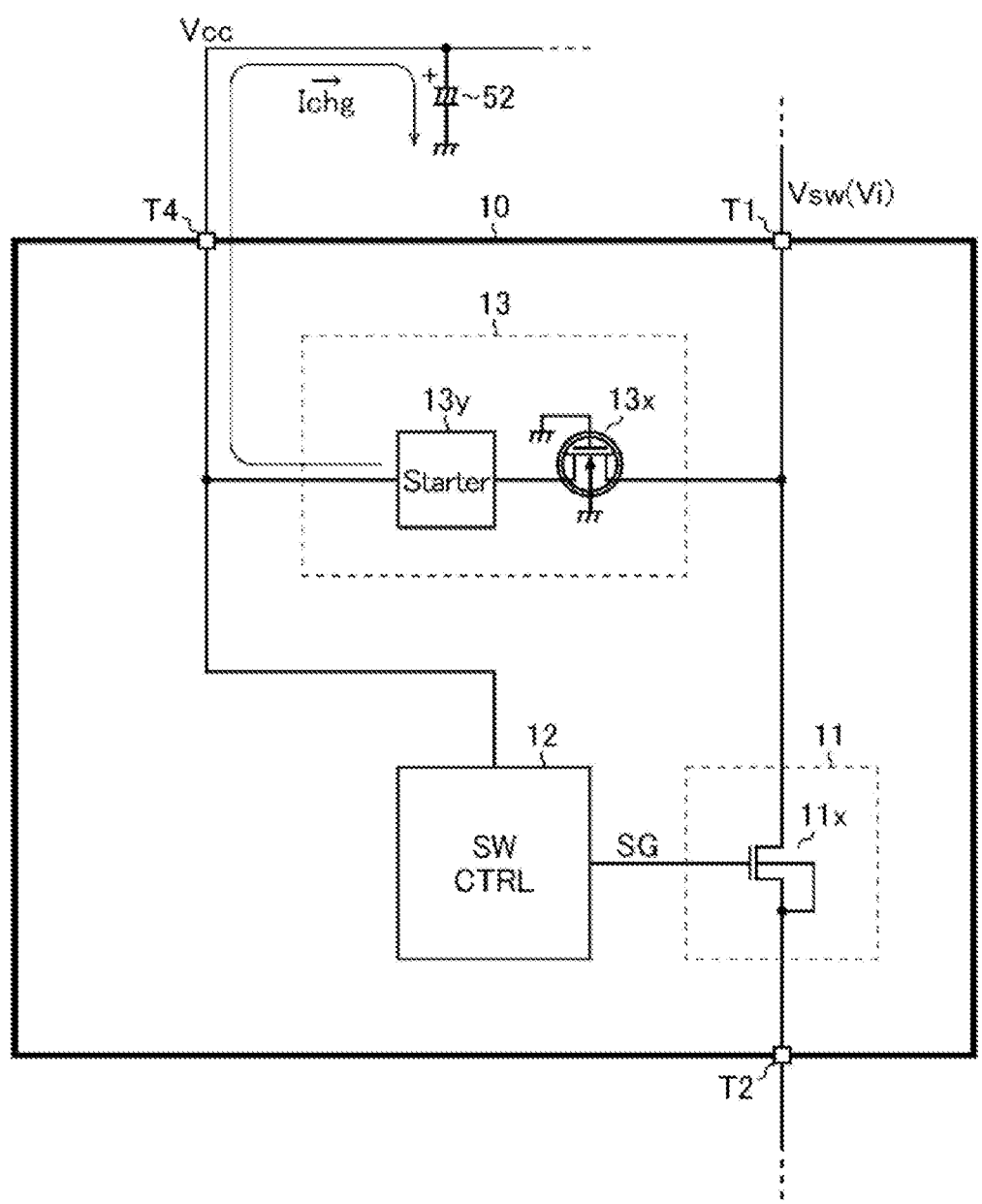
FIG. 3 is a diagram showing a comparative example of a start-up circuit

FIG. 3 is a diagram showing a comparative example of the start-up circuit. A start-up circuit 13 of this comparative example includes a depletion type high-withstand-voltage N-channel JFET (Junction Field Effect Transistor) 13x and a starter 13y. An enhancement type high-withstand-voltage N-channel MOSFET (Metal Oxide Semiconductor FET] 11x is used in the drive switch circuit 11 described above.

A drain of the JFET 13x is connected to the external terminal T1. A source of the JFET 13x is connected to the external terminal T4 via the starter 13y. A gate of the JFET 13x is connected to the ground terminal GND1 of the primary circuit system 1p.

The starter 13y electrically connects a path between the source of the JFET 13x and the external terminal T4 at the time of starting the power supply control device 10 (=before starting on/off control of the MOSFET 11x). Therefore, the power supply voltage Vcc is raised by charging the capacitor 52 by a charging current Ichg flowing from the external terminal T1 to the external terminal T4 via the start-up circuit 13.

On the other hand, the starter 13y cuts off the connection between the source of the JFET 13x and the external terminal T4 after the power supply control device 10 is started. Therefore, the charging subject of the capacitor 52 is switched to the auxiliary winding 23 described above.

When the connection between the source of the JFET 13x and the external terminal T4 is cut off, a source voltage of the JFET 13x rises. However, the JFET 13x is turned off when a gate-source voltage Vgs reaches an on-threshold voltage (e.g., −several tens of V). Therefore, the source voltage of the JFET 13x in which the gate is connected to the ground terminal GND1 is kept at about +several tens of V. Further, only a minute off-leakage current (several μA) flows through the JFET 13x kept in an off-state. As a result, power consumption of the start-up circuit 13 is only about several mW.

As described above, in the start-up circuit 13 of this comparative example, the power consumption can be significantly suppressed (e.g., several hundred mW→several mW) as compared with the conventional configuration in which the power supply voltage Vcc is raised by using, for example, a resistance voltage dividing circuit of the DC input voltage Vi.

However, in the start-up circuit 13 of this comparative example, the number of chips increases because the high-withstand-voltage JFET 13x is required in addition to the high-withstand-voltage MOSFET 11x that forms the drive switch circuit 11. Further, when the control circuit 12 and the start-up circuit 13 are integrated into one chip, the chip must be configured by a high-withstand-voltage process or the like. This increases a chip area and is not suitable for high frequency operations. Hereinafter, a new embodiment capable of solving such a problem will be proposed.

Start-Up Circuit (First Embodiment)

Figure 4:
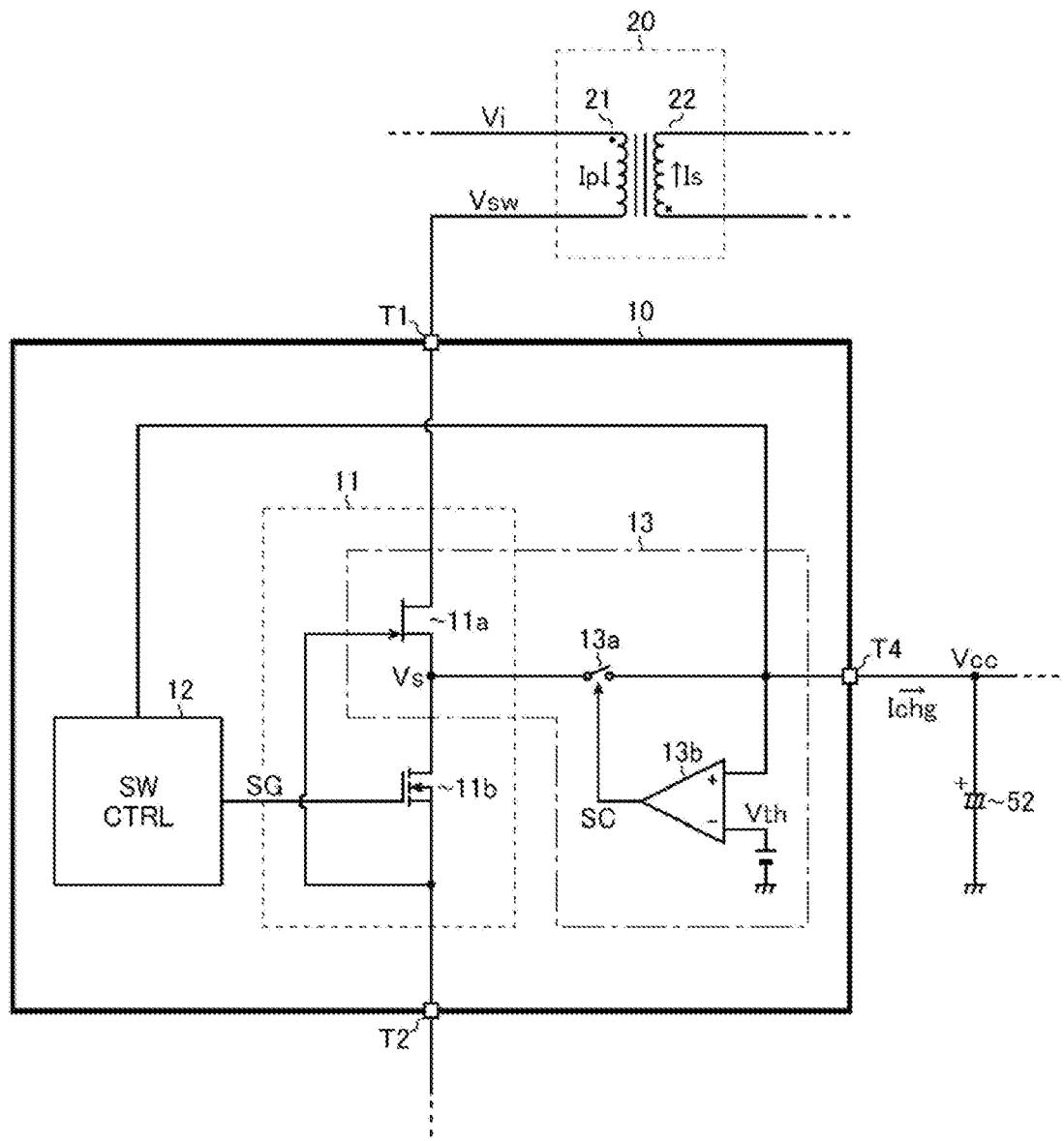
FIG. 4 is a diagram showing a first embodiment of a start-up circuit.

FIG. 4 is a diagram showing a first embodiment of the start-up circuit. As a premise for introducing a start-up circuit 13 of the present embodiment, the drive switch circuit 11 for driving the transformer 20 is formed by cascade-connecting a depletion type GaN-FET 11a (corresponding to a first transistor) and an enhancement type N channel MOSFET 11b (corresponding to a second transistor).

Figure 5:
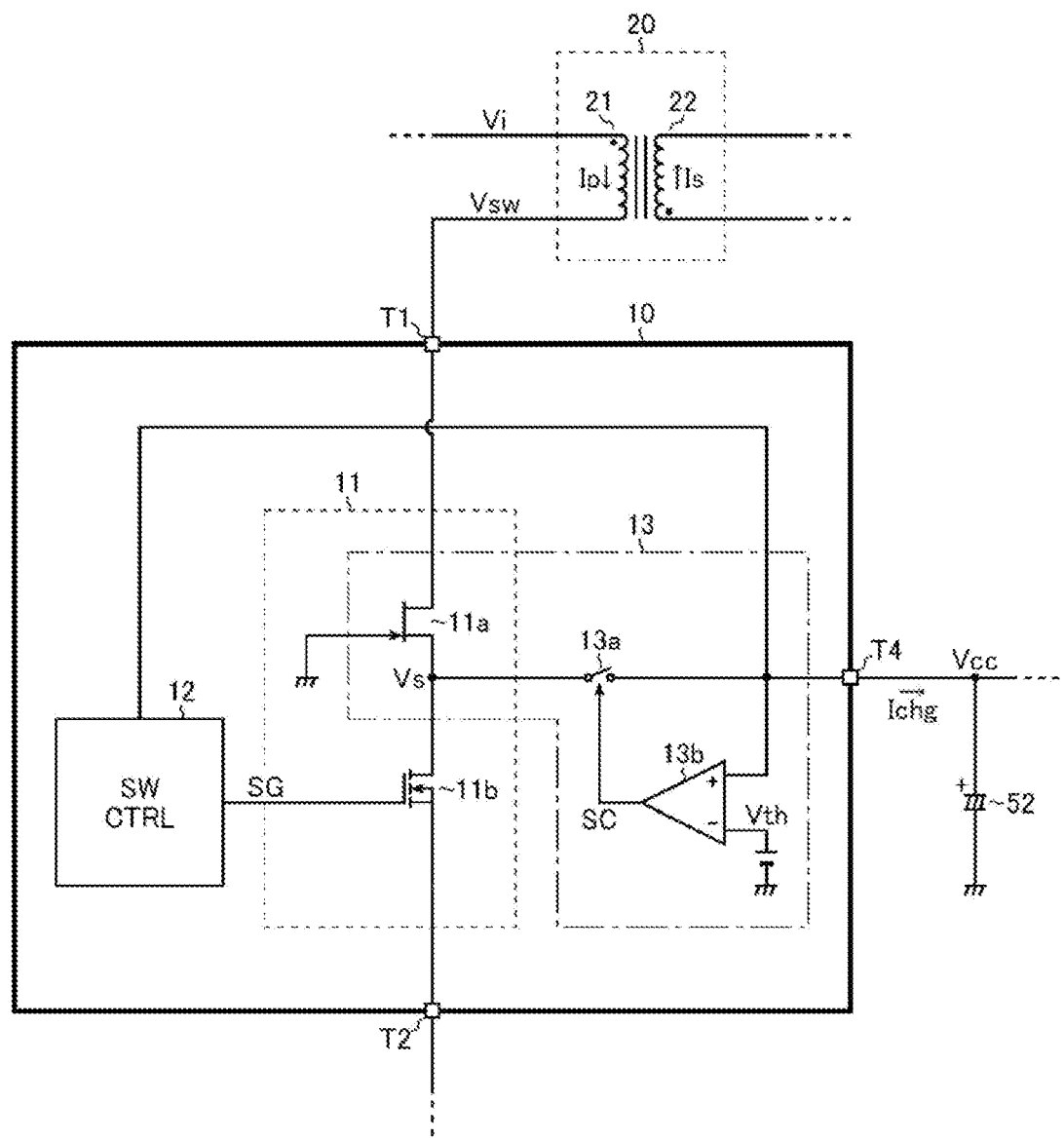
FIG. 5 is a diagram showing a modification of the first embodiment.

A connection relationship will be described in detail. A drain of the GaN-FET 11a is connected to the external terminal T1. A source of the GaN-FET 11a and a drain of the MOSFET 11b are connected to each other. Both a gate of the GaN-FET 11a and a source of the MOSFET 11b are connected to the external terminal T2 (=the terminal to which the sense voltage Vcs is applied). A gate of the MOSFET 11b is connected to an output terminal of the control circuit 12 (=an application terminal of the gate signal SG). A diode may be connected between the drain and the source of the GaN-FET 11a in order to improve stability of operation and safety of elements. In addition, as shown in FIG. 5, when cascade-connecting the GaN-FET 11a and the MOSFET 11b, the gate of the GaN-FET 11a may be connected to the ground terminal GND1.

The GaN-FET 11a is a depletion type (normally-on type) device, and cannot be turned off by itself unless a negative gate-source voltage Vgs is applied. Therefore, by cascade-connecting the enhancement type (normally-off type) MOSFET 11b, a normally-off operation is implemented by the entire drive switch circuit 11.

That is, the control circuit 12 is operated by receiving the power supply voltage Vcc, and controls on/off operation of the entire drive switch circuit 11 by controlling the MOSFET 11b using the gate signal SG.

For example, when the gate signal SG is at a high level (=Vcc), the MOSFET 11b is turned on and the gate-source voltage Vgs of the GaN-FET 11a becomes 0 V. Therefore, the GaN-FET 11a is turned on. On the other hand, when the gate signal SG is at a low level (=GND1), the MOSFET 11b is turned off and the gate-source voltage Vgs of the GaN-FET 11a becomes negative. Therefore, the GaN-FET 11a is turned off.

As described above, when the drive switch circuit 11 is viewed as a whole, the drive switch circuit 11 is turned on when the gate signal SG is at a high level, and is turned off when the gate signal SG is at a low level.

By the way, when the MOSFET 11b is turned off, a source voltage Vs of the GaN-FET 11a is balanced with a voltage value (e.g., about several tens of V) corresponding to the off-leakage current (e.g., several μA) and the on-threshold voltage (e.g., −several tens of V).

Therefore, by utilizing the above characteristics, the start-up circuit 13 is configured to charge the power supply voltage Vcc of the control circuit 12 by the source voltage Vs of the GaN-FET 11a at the time of start-up (or operation) of the power supply control device 10.

More specifically, the start-up circuit 13 of the present embodiment includes a switching circuit 13a and a comparison circuit 13b.

The switching circuit 13a electrically connects or cuts off a path between the source of the GaN-FET 11a (=the application terminal of the source voltage Vs) and the external terminal T4 (=the application terminal of the power supply voltage Vcc) based on a comparison signal SC input from the comparison circuit 13b. For example, the switching circuit 13a is turned on when the comparison signal SC is at a low level, and is turned off when the comparison signal SC is at a high level.

The comparison circuit 13b generates the comparison signal SC for controlling the switching circuit 13a by comparing the power supply voltage Vcc input to a non-inverting input terminal (+) from the external terminal T4 with a predetermined threshold voltage Vth input to an inverting input terminal (−). The comparison signal SC has a low level when Vcc<Vth and a high level when Vcc>Vth.

The start-up circuit 13 of the present embodiment electrically connects the path between the source of the GaN-FET 11a and the external terminal T4 by turning on the switching circuit 13a when the power supply voltage Vcc is lower than the threshold voltage Vth. Therefore, for example, when the power supply voltage Vcc is lower than the threshold voltage Vth at the time of starting the power supply control device 10, the capacitor 52 is charged by the charging current Ichg flowing from the external terminal T1 to the external terminal T4 via the start-up circuit 13, whereby the power supply voltage Vcc rises.

Immediately after the power supply control device 10 is started, the gate-source voltage Vgs of the GaN-FET 11a is approximately 0 V. Therefore, the GaN-FET 11a may allow a sufficiently large charging current Ichg (e.g., several mA) to flow therethrough. Therefore, the capacitor 52 can be rapidly charged to quickly raise the power supply voltage Vcc.

On the other hand, the start-up circuit 13 cuts off the path between the source of the GaN-FET 11a and the external terminal T4 by turning off the switching circuit 13a when the power supply voltage Vcc becomes higher than the threshold voltage Vth. Therefore, after the power supply voltage Vcc has risen sufficiently, the charging subject of the capacitor 52 is switched to the auxiliary winding 23 described above.

As described above, in the start-up circuit 13 of the present embodiment, by allowing the GaN-FET 11a of the drive switch circuit 11 to function as a part of the start-up circuit 13, the high-withstand-voltage JFET 13x adopted in the above-described comparative example (FIG. 3) becomes unnecessary, and thus the number of chips can be reduced.

Further, even after the power supply control device 10 is started, when maintenance of the power supply voltage Vcc by the auxiliary winding 23 is hindered and the power supply voltage Vcc falls below the threshold voltage Vth, the switching circuit 13a is turned on. At this time, the source voltage Vs of the GaN-FET 11a rises every off period of the MOSFET 11b that arrives periodically, and finally rises to several tens of V. Therefore, the capacitor 52 can be charged by the off-leakage current of the GaN-FET 11a (which depends on the gate-source voltage Vgs of the GaN-FET 11a and may be, for example, several mA or more). This makes it possible to suppress a decrease in the power supply voltage Vcc. The off-leakage current of the GaN-FET 11a is finally reduced to several μA (minimum value).

Considering the operation principle of the start-up circuit 13 described above, it is possible to use a depletion type transistor other than the GaN device instead of the GaN-FET 11a.

Start-Up Circuit (Second Embodiment)

Figure 6:
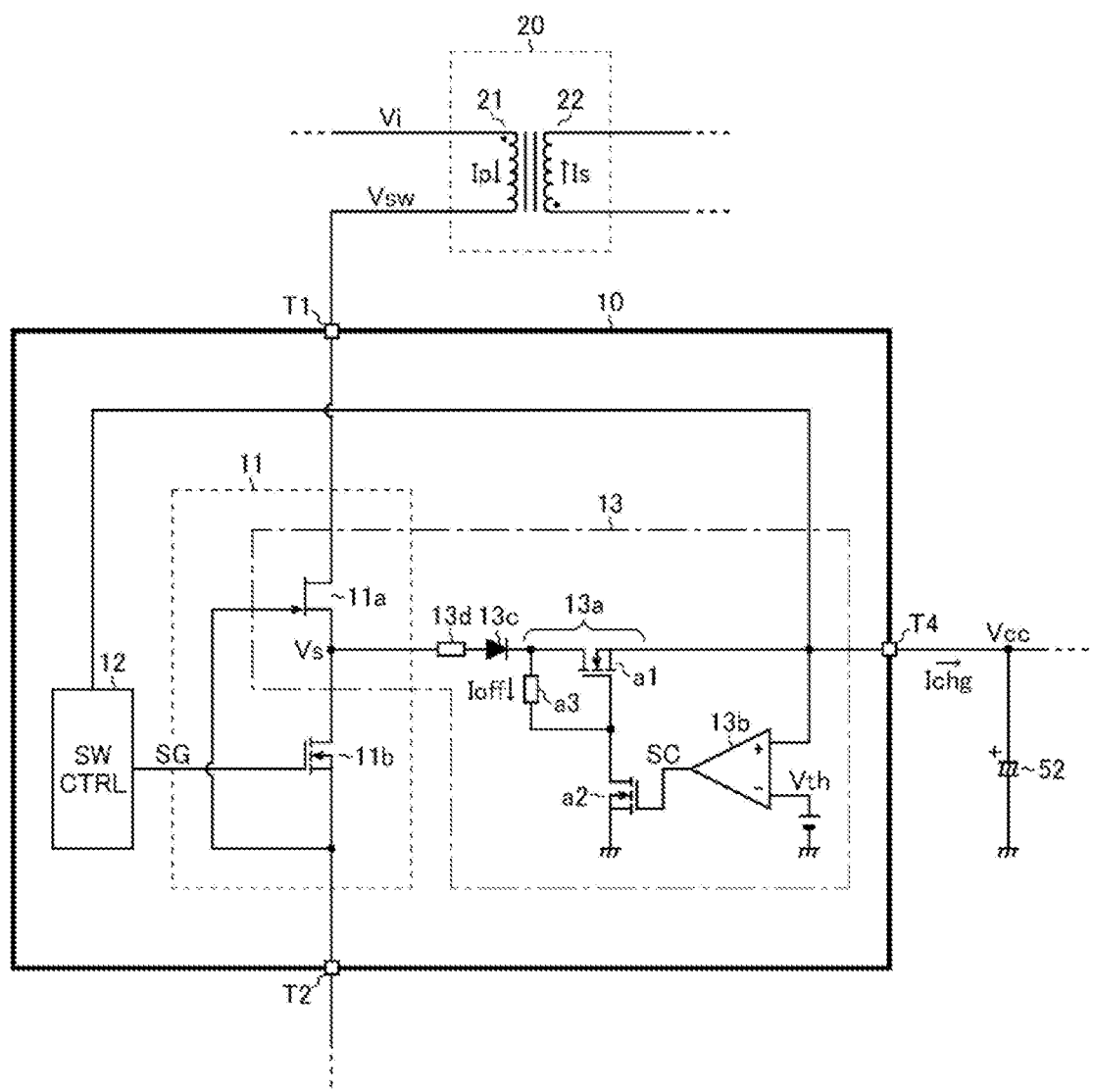
FIG. 6 is a diagram showing a second embodiment of a start-up circuit.

FIG. 6 is a diagram showing a second embodiment of the start-up circuit. The start-up circuit 13 of the present embodiment is based on the first embodiment (FIG. 4) described above, and further includes a diode 13c and a resistor 13d (corresponding to a first resistor).

Further, in FIG. 6, enhancement type N-channel MOS-FETs a1 and a2 (corresponding to a third transistor and a fourth transistor, respectively) and a resistor a3 (corresponding to a second resistor) are concretely depicted as components of the switching circuit 13a.

A first end of the resistor 13d is connected to the source of the GaN-FET 11a (=the application terminal of the source voltage Vs). A second end of the resistor 13d is connected to an anode of the diode 13c. Both a cathode of the diode 13c and a first end of the resistor a3 are connected to a drain of the MOSFET a1. A source of MOSFET a1 is connected to the external terminal T4 (=the application terminal of power supply voltage Vcc). Both a gate of the MOSFET a1 and a second end of the resistor a3 are connected to a drain of the MOSFET a2. A source of the MOSFET a2 is connected to the ground terminal GND1 of the primary circuit system 1p. A gate of the MOSFET a2 is connected to an output terminal of the comparison circuit 13b (=the application terminal of the comparison signal SC).

When Vcc<Vth, SC=L (the comparison signal has a low level). Therefore, the MOSFET a2 is turned off. As a result, the gate of the MOSFET a1 is pulled up via the resistor a3 (several MΩ), so that the MOSFET a1 is turned on. This state corresponds to an on state of the switching circuit 13a, in which the path between the source of the GaN-FET 11a and the external terminal T4 is electrically connected. Accordingly, the power supply voltage Vcc is raised by charging the capacitor 52 using the charging current Ichg flowing from the external terminal T1 to the external terminal T4 via the start-up circuit 13.

On the other hand, when Vcc>Vth, SC=H (the comparison signal has a high level). Therefore, the MOSFET a2 is turned on. As a result, the gate of the MOSFET a1 is short-circuited to the ground terminal GND1, so that the MOSFET a1 is turned off. This state corresponds to an off state of the switching circuit 13a, in which the path between the source of the GaN-FET 11a and the external terminal T4 is cut off. Accordingly, the charging subject of the capacitor 52 is switched to the auxiliary winding 23 described above.

After the transition of the switching circuit 13a to the off state, the source voltage Vs of the GaN-FET 11a becomes a pulse waveform (e.g., 0 V to 20 V) having a predetermined peak value along with the switching drive of the MOSFET 11b (e.g., fsw=500 kHz).

Therefore, when the source of the GaN-FET 11a and the drain of the MOSFET a1 are connected directly to each other, an unnecessary switching loss may occur due to the charging and discharging of a parasitic capacitor attached to the drain of the MOSFET a1.

Therefore, in the start-up circuit 13 of the present embodiment, the diode 13c having a direction illustrated in FIG. 6 is inserted between the source of the GaN-FET 11a and the drain of the MOSFET a1. Accordingly, when the MOSFET 11b is turned on, the diode 13c becomes reverse-biased and the drain voltage of the MOSFET a1 is maintained at a substantially constant value (e.g., 20 V). Thus, it becomes possible to suppress the switching loss described above.

Further, in the start-up circuit 13 of the present embodiment, the resistor 13d is inserted between the source of the GaN-FET 11a and the drain of the MOSFET a1. Accordingly, it is possible to reduce an off-current Ioff of the start-up circuit 13 (=a current flowing from the external terminal T1 to the ground terminal GND1 via the GaN-FET 11a, the resistor 13d, the diode 13c, the resistor a3, and the MOSFET a2). It is desirable that a resistance value of the resistor 13d is appropriately set in consideration of the balance between the reduction of the off-current Ioff and securing of the charging current Ichg.

Start-Up Circuit (Third Embodiment)

Figure 7:
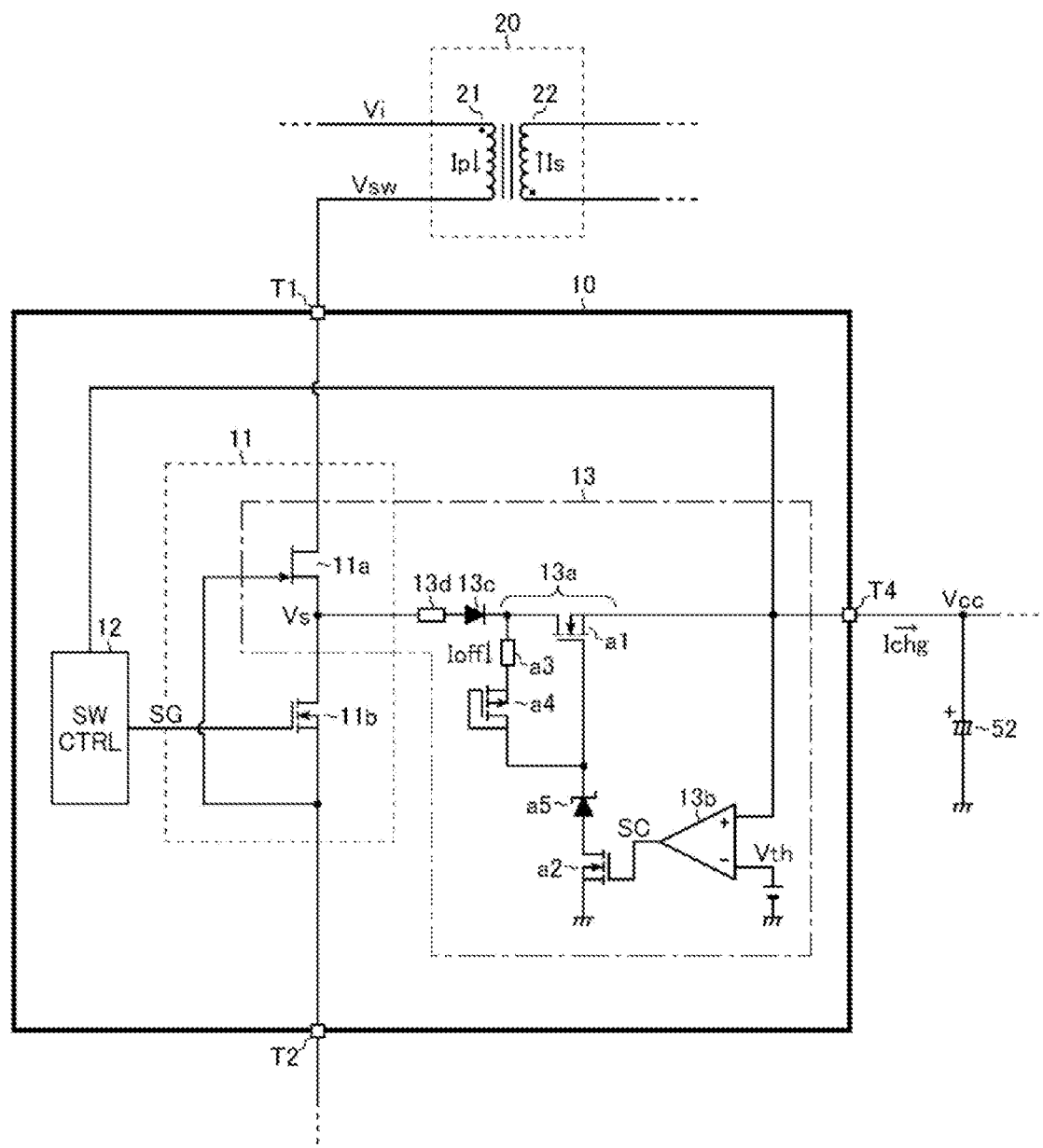
FIG. 7 is a diagram showing a third embodiment of a start-up circuit.

FIG. 7 is a diagram showing a third embodiment of the start-up circuit. The start-up circuit 13 of the present embodiment is based on the second embodiment (FIG. 6) described above, and further includes an enhancement type P-channel MOSFET a4 (corresponding to a fifth transistor) and a Zener diode a5 as components of the switching circuit 13a.

Changes in the connection relationship will be described. A source of the MOSFET a4 is connected to the second end of the resistor a3. Both a gate and a drain of the MOSFET a4 are connected to the gate of the MOSFET a1. In this way, the MOSFET a4 is diode-connected between the gate and the drain of the MOSFET a1.

A cathode of the Zener diode a5 is connected to the gate of the MOSFET a1. An anode of the Zener diode a5 is connected to the drain of the MOSFET a2. In this way, the Zener diode a5 is connected between the gate of the MOSFET a1 and the ground terminal GND1.

In the start-up circuit 13 of the present embodiment, when the switching circuit 13a is turned off, a voltage applied to the second end of the resistor a3 can be increased (and a voltage across the resistor a3 can be decreased). Accordingly, it is possible to further reduce the off-current Ioff described above.

<GaN Device>

Figure 8:
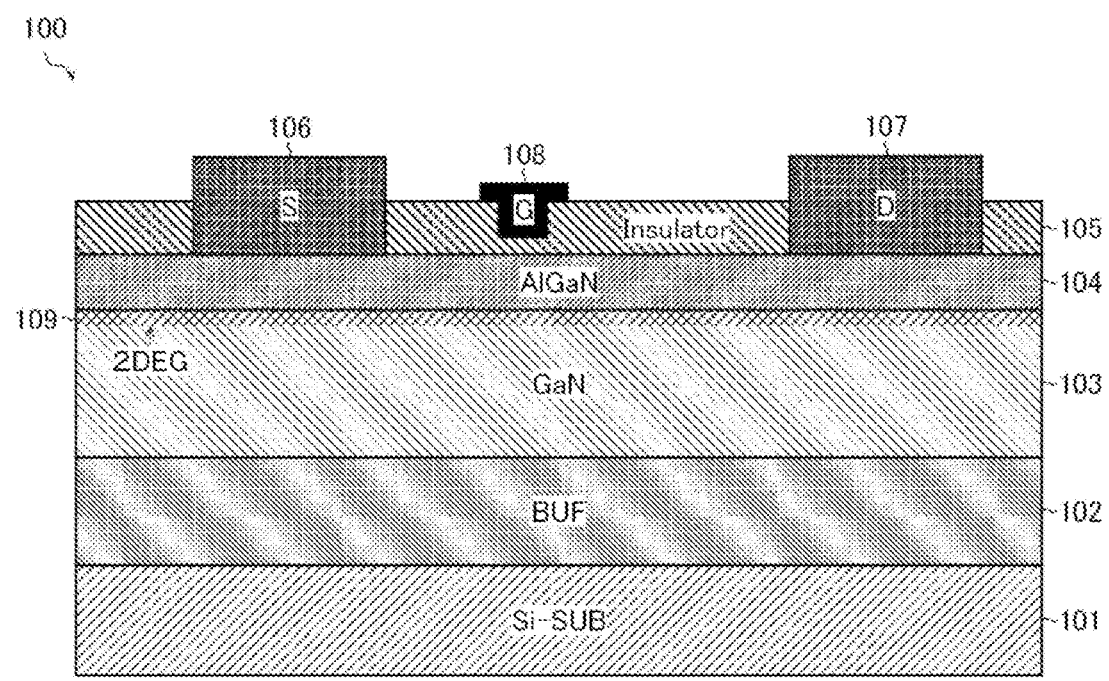
FIG. 8 is a diagram schematically showing a structure of a GaN device.

FIG. 8 is a diagram schematically showing a structure of a GaN device. A GaN device 100 shown in FIG. 8 is a device used as the above-described GaN-FET 11a, and is formed by laminating a S1 substrate 101, a buffer layer 102, a GaN layer 103, an AlGaN layer 104, and an insulating layer 105 sequentially from the bottom. Further, a source 106, a drain 107, and a gate 108 are exposed on a surface of the insulating layer 105.

In high-withstand-voltage Si devices, a structure (so-called vertical structure) in which a source and a gate are provided on a side of a front surface and a drain is provided on a side of a back surface is often adopted. On the other hand, in the GaN device 100, a structure (so-called horizontal structure) in which the source 106, the drain 107, and the gate 108 are all provided on the same surface is adopted. The reason for adopting such a horizontal structure is to use a 2DEG layer (two-dimensional electron gas layer) 109 existing at an interface between the GaN layer 103 and the AlGaN layer 104, which form a hetero-structure, as a current path.

Since the 2DEG layer 109 has high electron mobility (about 1,500 cm$^2$/Vs), a very fast switching operation becomes possible. However, as a trade-off, the current path always exists. Therefore, the GaN device 100 serves as a depletion type (normally-on type) device in which a drain current Id flows even when a gate-source voltage Vgs is 0 V.

<Packaging>

Figure 9:
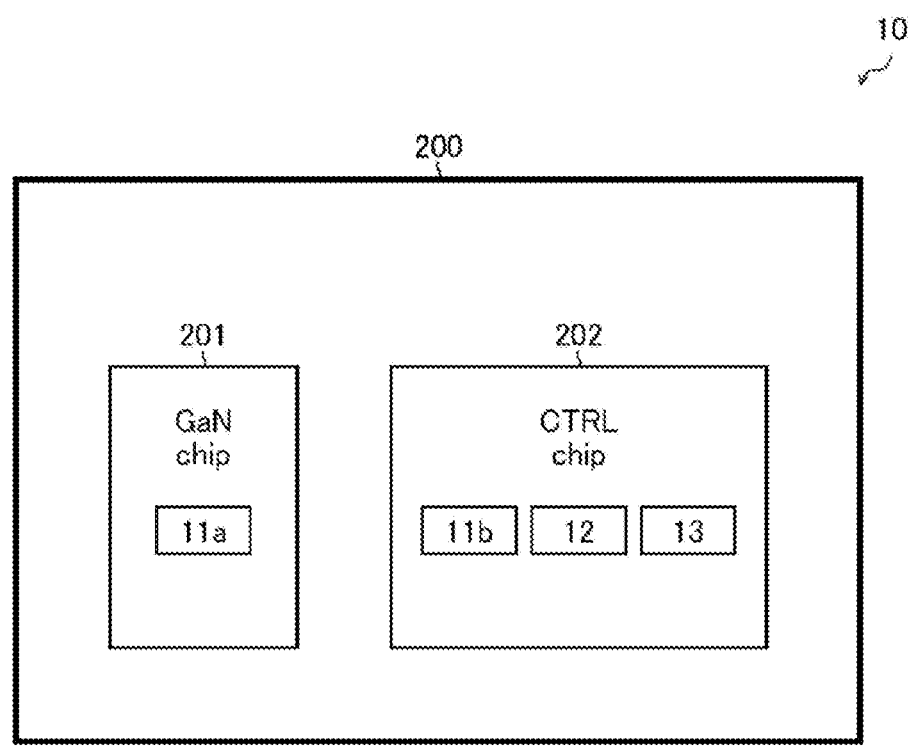
FIG. 9 is a diagram showing a packaging example of a power supply control device.

FIG. 9 is a diagram showing a packaging example of the power supply control device 10. The power supply control device 10 adopting the start-up circuit 13 of any of the first to third embodiments may be formed by sealing a GaN chip 201 (corresponding to a first chip) and a controller chip 202 (corresponding to a second chip) in a single package 200.

The GaN-FET 11a is integrated in the GaN chip 201. On the other hand, the MOSFET 11b, the control circuit 12, and the start-up circuit 13 are integrated in the controller chip 202.

As described above, the GaN chip 201, which is required to have a high withstand voltage (e.g., a withstand voltage of 600 V), is a separate chip separated from the controller chip 202. Accordingly, the controller chip 202 can be formed by a low-withstand-voltage Si process (e.g., a withstand voltage of 30 V). Therefore, a chip area can be reduced and high frequency operations can be facilitated. The MOSFET 11b may be formed as a separate chip when necessary.

<Other Modifications>

In addition to the above-described embodiments, various technical features disclosed in the subject specification can be modified in various ways without departing from the spirit of the technical creation.

For example, in the above-described embodiments, the fly-back type insulated switching power supply has been described as an example. However, the application target of the present disclosure is not limited thereto. The present disclosure can also be applied to, for example, a forward type insulated switching power supply.

Further, in the above-described embodiments, the PWM drive method has been described as an example of the switching drive method performed by the power supply control device. It may also be optional to adopt other switching drive methods such as, for example, a PFM drive method (a fixed on-time method, a fixed off-time method, or a window comparator method).

According to the present disclosure in some embodiments, it is possible to reduce a size of the power supply control device and to allow high frequency operations.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A power supply control device, comprising:
   a drive switch circuit including a depletion type first transistor and an enhancement type second transistor, which are cascade-connected to each other, and configured to drive a transformer of an insulated switching power supply;
   a control circuit configured to control the second transistor; and
   a start-up circuit configured to charge a power supply voltage of the control circuit by using a source voltage of the first transistor,
   wherein the start-up circuit includes:
      a switching circuit configured to electrically connect or cut off a path between an application terminal of the source voltage and an application terminal of the power supply voltage; and
      a comparison circuit configured to control the switching circuit by comparing the power supply voltage with a predetermined threshold voltage, and
   wherein the switching circuit includes:
      a third transistor connected between the application terminal of the source voltage and the application terminal of the power supply voltage;
      a fourth transistor connected between a gate of the third transistor and a reference potential terminal, and configured to be controlled according to an output signal of the comparison circuit; and
      a second resistor connected between the gate and a drain of the third transistor.

2. The power supply control device of claim 1, wherein the first transistor is a GaN device.

3. The power supply control device of claim 1, wherein the start-up circuit further includes a diode connected between the application terminal of the source voltage and the switching circuit.

4. The power supply control device of claim 1, wherein the start-up circuit further includes a first resistor connected between the application terminal of the source voltage and the switching circuit.

5. The power supply control device of claim 1, wherein the switching circuit further includes a fifth transistor diode-connected between the gate and the drain of the third transistor.

6. The power supply control device of claim 1, wherein the switching circuit further includes a Zener diode connected between the gate of the third transistor and the reference potential terminal.

7. The power supply control device of claim 1, which includes a first chip and a second chip sealed in a package,
   wherein the first transistor is integrated in the first chip, and
   wherein the second transistor, the control circuit, and the start-up circuit are integrated in the second chip.

8. An insulated switching power supply, comprising:
   a transformer including a primary winding connected to an application terminal of an input voltage, and a secondary winding and an auxiliary winding which are magnetically coupled to the primary winding;
   an output voltage generation part configured to generate an output voltage from an induced voltage of the secondary winding;
   a power supply voltage generation part configured to generate a power supply voltage from an induced voltage of the auxiliary winding; and
   the power supply control device of claim 1 configured to control drive of the transformer by receiving the power supply voltage.

* * * * *